(12) United States Patent
Rose

(10) Patent No.: US 6,861,651 B2
(45) Date of Patent: Mar. 1, 2005

(54) ELECTRON-OPTICAL CORRECTOR FOR ELIMINATING THIRD-ORDER ABERATIONS

(75) Inventor: Harald Rose, Darmstadt (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 0 days.

(21) Appl. No.: 10/169,995
(22) PCT Filed: Jan. 12, 2001
(86) PCT No.: PCT/DE01/00102
  § 371 (c)(1),
  (2), (4) Date: Jul. 12, 2002
(87) PCT Pub. No.: WO01/52301
  PCT Pub. Date: Jun. 19, 2001

(65) Prior Publication Data
US 2003/0034457 A1 Feb. 20, 2003

(30) Foreign Application Priority Data
Jan. 14, 2000 (DE) .......................... 100 01 277

(51) Int. Cl.$^7$ .............. H01J 3/14; H01J 3/26; H01J 47/00
(52) U.S. Cl. ............... 250/396 R; 250/396 ML; 250/305; 250/311; 250/398
(58) Field of Search .............. 250/396 R, 396 ML, 250/305, 311, 398

(56) References Cited

U.S. PATENT DOCUMENTS

| | | | |
|---|---|---|---|
| 2,919,381 A | 12/1959 | Glaser | |
| 4,389,571 A | 6/1983 | Crewe | |
| 5,449,914 A * | 9/1995 | Rose et al. | 250/396 ML |
| 5,793,048 A * | 8/1998 | Petric et al. | 250/396 ML |
| 6,329,659 B1 * | 12/2001 | Krijn et al. | 250/396 R |
| 6,384,412 B1 * | 5/2002 | Krahl et al. | 250/305 |

OTHER PUBLICATIONS

Crewe, Optik, vol. 69, No. 1, pp. 24–29 (1984).
Crewe, Optik, vol. 60, No. 3, pp. 271–281 (1982).

* cited by examiner

Primary Examiner—Frank G. Font
Assistant Examiner—Mary El-Shammaa
(74) Attorney, Agent, or Firm—Birch, Stewart, Kolasch & Birch, LLP

(57) ABSTRACT

The invention relates to an electron-optical corrector for eliminating third-order aberrations, such as spherical aberrations, field curvature and off-axis astigmatism; said corrector being devoid of third-order off-axis coma, third-order distortion and first-order chromatic aberration of the first degree. The corrector has a construction which is symmetrical about the central plane in the direction of the linear optical axis. A hexapole $S_1$ of length $l_1$ is first positioned in the direction of the beam path, followed by a circular lens $R_1$, a hexapole $S_2$ of length $l_2$ and subsequently a circular lens $R_2$ which is followed by a third hexapole $S_3$ with the same strength with the same strength of the hexapole $S_1$ and double the length of the latter $l_3=2l_1$. The separation of the two circular lenses $R_1$, $R_2$ and the distance from the circular lens to the first hexapole $S_1$ is chosen in such a way that the internal plane of $S_1$ comes to rest in the front principal focus of the circular lens that is positioned downstream and the center of the hexapoles $S_2$ and $S_3$ is located on the focal plane. Additional elements of the corrector also follow in sequence, said elements being symmetrical about the central plane $Z_m$ of the hexapole $S_3$.

26 Claims, 1 Drawing Sheet

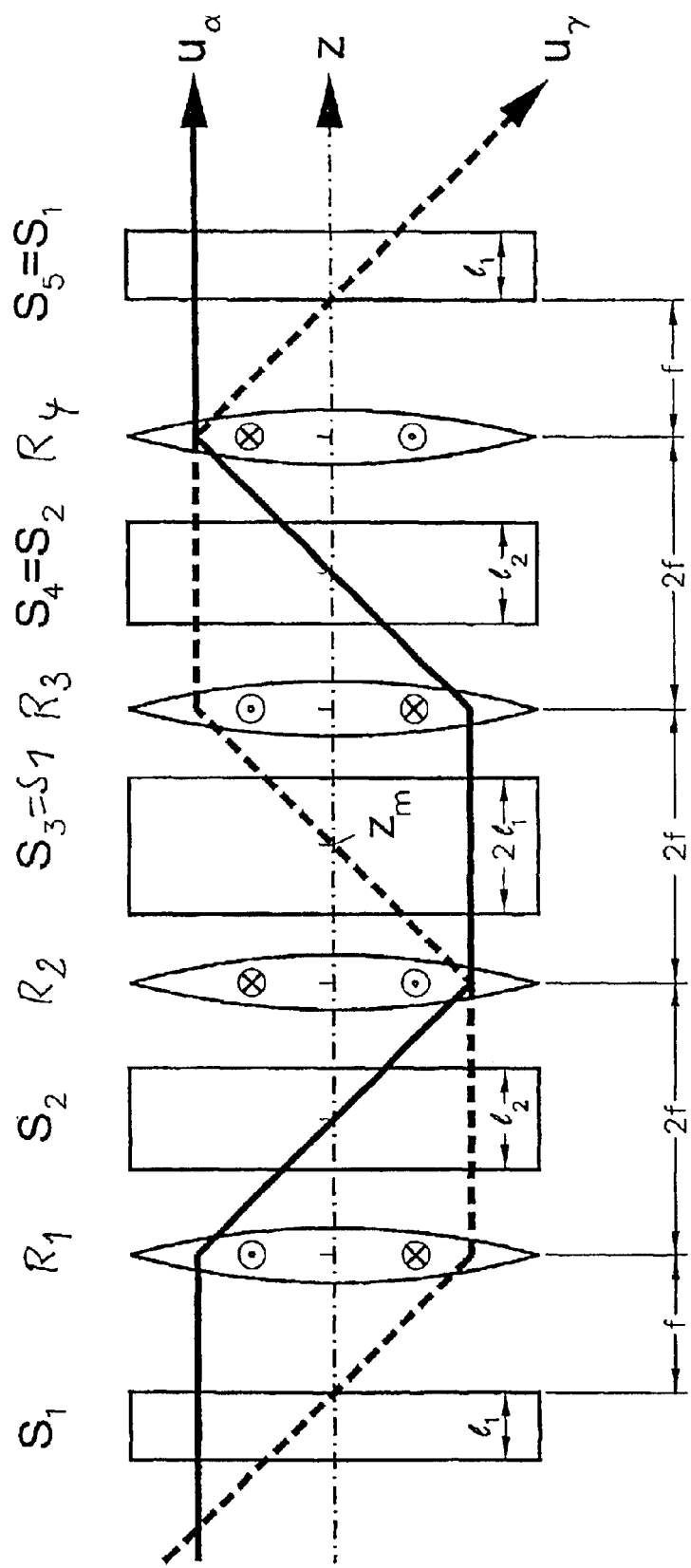

ELECTRON-OPTICAL CORRECTOR FOR ELIMINATING THIRD-ORDER ABERATIONS

This application is the national phase under 35 U.S.C. § 371 of PCT International Application No. PCT/DE01/00102 which has an International filing date of Jan. 12, 2001, which designated the United States of America.

BACKGROUND OF THE INVENTION

1. Field of the Invention

The invention relates to an electron-optical corrector for eliminating third-order aberrations, such as spherical aberrations, field curvature and off-axis astigmatism. The corrector being devoid of third-order off-axis coma, third-order distortion and first-order chromatic aberrations of the first degree. The corrector has a construction which is symmetrical about the central plane in the direction of the linear optical axis. A hexapole $S_1$ of length $l_1$ is first positioned in the direction of the beam path, followed by a circular lens $R_1$, a hexapole $S_2$ of length $l_2$.

2. Description of the Background Art

The efficiency of electron-optical systems, which in the sense of this invention are also understood to include those with ion-imaging systems, is limited by their image aberrations, of which, depending on the specific application and the extent of the corrections already made, particular image aberrations are responsible for limiting the performance, the elimination of which represents considerable progress in the improvement of electron-optical systems. It is possible to systematically subdivide and classify the image aberrations into axial image aberrations, which are also determined by the fundamental paths emerging in the two sections of the optical axis in the object plane, off-axis image aberrations, which in turn are dependent on the fundamental paths emerging outside the optical axis in the object plane, and chromatic aberrations, which only occur with different speeds of the imaging electrons. With magnifying electron-optical systems, such as those used in electron microscopy, it is most important to eliminate the axial image aberrations to increase efficiency. With reducing electron-optical systems, such as those used in lithography for inscribing objects by means of electron beams, the elimination of off-axis image aberrations is decisive.

The aim is always to set up and adjust, in its entirety, the system comprising the imaging lens system and the corrector such that the efficiency-limiting image aberrations of the entire system are eliminated or substantially minimised, the corrector having the function of, on one hand, achieving, by negative image aberration coefficients, an elimination or at least a reduction, and on the other hand not causing an increase, of disadvantageous image aberration coefficients.

Optik 69 No. 1 (1984) 24–29 discloses the use of two hexapoles for the correction of electron-optical image aberrations in circular lenses. These correction elements are also used for eliminating the first order spherical aberration (Optik 60 No. 3 (1982) 271–281).

SUMMARY OF THE INVENTION

It is therefore an object of the present invention to provide an electron-optical corrector, with the aid of which, in addition to the first order, first degree chromatic aberration, all third-order image aberrations, such as spherical aberrations, field curvature, off-axis astigmatism, off-axis coma, and distortion are eliminated in such a way that no additional off-axis image aberration is generated.

This object is achieved according to the invention in that it is followed by a circular lens ($R_2$), which is followed by a third hexapole ($S_3$) with the same strength as the hexapole ($S_1$) and twice the length 13=2l1 thereof, the separation of the two circular lenses ($R_1$, $R_2$) of the same strength being 2f of the focal length, the hexapole ($S_2$) being positioned in the principal focus between the two circular lenses ($R_1$, $R_2$), and the distance of the circular lens from the first hexapole ($S_1$) being chosen such that the plane of the ($S_1$), which is assigned to the corrector centre, comes to lie in the front principal focus of the circular lens that is positioned downstream, and the centre of the hexapoles ($S_2$) and ($S_3$) is positioned in the focal plane of the circular lenses ($R_1$, $R_2$) and this is finally followed by two further circular lenses ($R_3$, $R_4$) and hexapoles ($S_4$, $S_5$), which are set up symmetrically to the centre plane $Z_m$ of the hexapole ($S_3$).

To produce the required telescopic Gaussian ray path, the distance between adjacent circular lenses is in each case 2f, f representing the focal length of the circular lens. The hexapoles $S_2$, $S_4$ and $S_3$ are to be positioned with their centres, in each case, being positioned in the principal focus of the circular lenses. The hexapoles $S_1$ and $S_5$ are assigned such that their respective inner plane comes to lie in the focal point of the circular lens. To prevent the occurrence of second order aberrations, the strength of the hexapole lenses $S_1$, $S_3$ and $S_5$ is in each case the same. In addition, $S_2=S_4$ is adjusted, however their strength can be chosen completely independently of $S_1$, $S_3$ and $S_5$. However, a symmetry with respect to the central plane $Z_m$ in the set up and adjustment must always be ensured.

To eliminate spherical aberrations, field curvature and off-axis astigmatism (all third-order aberrations), the intensity of the hexapoles $S_1$ and $S_2$ are available and parameters that can be chosen freely and independently of one another. By corresponding setting, two of the aforementioned image errors in the entire system can be eliminated. For purposes of lithography, it is most important to eliminate off-axis astigmatism as well as the field curvature. Although the third-order spherical aberration of the corrector is negative and leads to a reduction of the overall aberration, however, in the most general cases it does not become zero. By means of an appropriate spatial positioning in the overall system and corresponding choice of distance from the adjacent lenses, it can be achieved for a particular enlargement that the third-order spherical aberration of the entire system can be compensated.

In addition to the elimination of the aforementioned image aberrations, the corrector itself is also free of third-order distortion and coma and of first-order, first degree off-axis chromatic aberrations, so that when the corrector is installed in a correspondingly aberration-free electron-optical system the entire system also remains free of these aberrations. For a magnification unequal to 1, theoretical considerations require that a system free of off-axis coma and distortion must consist of at least four lenses.

The decisive advantages of the proposed corrector include, with appropriately setting and spatial positioning of the spherical aberrations, adjusting the field curvature and the off-axis astigmatism (all third order) such that the entire system becomes aberration free, but also that further image aberrations, namely third order distortion, off-axis coma and first order, first degree chromatic aberration of the entire system are not increased by virtue of the corrector, since it is itself aberration-free.

In the most general case, the hexapoles are always aligned relative to one another in the same section. In cases where magnetic lenses are used, the magnetic field leads to an anisotrope (azimuthal component), which leads to image rotation. For aberration elimination, a rotation of the sections of the hexapoles $S_2$ and $S_4$ which lie in the same section, occurs relative to the hexapoles $S_1$, $S_3$ and $S_5$, which are also aligned in a common section. The angle of rotation is determined by the magnitude of the anisotropic component determined by the magnetic field.

The rotation of the hexapoles can then take place with maintenance of the mechanical orientation by electrostatic means, if, to generate the hexapole field, a twelve-pole is used, which permits a rotation of the sections about any desired angle by corresponding repoling of the electrodes. It correspondingly becomes possible, after installation of the twelve poles, to rotate the hexapole field by the desired angle by corresponding change of the poling.

The corrector proposed above eliminates image aberrations up to third order. In a particularly preferred embodiment, two of these correctives are positioned one behind the others in series and optically connected to one another by a circular lens doublet. The distance of the two circular lenses 2f and the distance of the last hexapole of the first corrector to the first circular lens, and the distance between the second circular lens and the adjacent hexapole is also equal to the focal length f. By means of such a linking, an antisymmmetric beam path is obtained in both correctors, which leads to mutual compensation of the fourth-order aberrations of the two individual correctives. Since the remaining circular lenses are free of fourth order aberrations, only fifth and higher order aberrations remain. A corrector with this optical property is designated as a double astigmat.

The corrector proposed according to the invention is preferably used in a size-reducing electron-optical system, as is used in lithography, and which is used to reduce in size particular structures defined by a mask by the electron-optical system and impress and write them on a crystal (wafer) located in the image plane by the incident electrodes. The essential factor is the creation of electronic devices and integrated circuits with the smallest possible dimensions, the electron-optical systems, in comparison to light-optical images, having the advantage of being able to reproduce much finer structures because of their much smaller wavelength. Here, the corrector is brought into the beam path downstream of the projection lens located behind the object plane and, at the output side—if appropriate with the interposition of a transfer lens—the operating part (wafer) is written on via an objective in the image plane. The term objective lens can be interpreted broadly, and may include a system composed of a plurality of lenses. The proposed corrector has the particular advantage to be able to eliminate image aberrations limiting the effectiveness of electron-optical size-reducing imaging systems. A considerable improvement of the imaging quality is consequently to be expected.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

The FIGURE shows a section along the optical axis and reproduction of the Gaussian fundamental paths.

DETAILED DESCRIPTION OF THE PREFERRED EMBODIMENTS

The diagrammatic illustration is kept in a schematic view. The hexapoles are here represented by $S_i$, their lengths by $l_i$ and the circular lenses by $R_i$. The corrector has the following construction:

At the inlet side, there is located the first hexapole $S_1$ of length $L_1$. This is followed by the circular lens doublet having the circular lenses $R_1$ and $R_2$. The focal length of the two circular lenses $R_1$ and $R_2$ being identical, and their distance being chosen as equal to 2f, f being the focal length, such that the circular lens doublet in its totality generates a telescopic beam path. Between the two circular lenses $R_1$, $R_2$, the second hexapole $S_2$, of length $l_1$, is located in the focal plane. The first hexapole $S_1$ is located at a distance such that its inner plane comes to lie in the focal point of the downstream circular lens. The third hexapole $S_3$ in the direction of the beam path is chosen such that in its intensity it is equal to the first hexapole $S_1$, but of double its length $l_3=2l_1$. The spatial assignment takes place such that the centre plane of the third hexapole $S_3$ comes to lie in the focal plane $Z_n$ of the circular lens.

The further construction of the corrector in the direction of the beam path is symmetrical to this central plane $Z_m$, so that both as regards the spatial positioning as well as the chosen pole strength, reference can be made to the previous models in order to avoid repetitions.

The above-described corrector has two freely selectable parameters, namely the strength of the hexapole $S_1$ (and thereby also that of the hexapoles $S_3$ and $S_5$) as well as the strength of the hexapole $S_2$ (and thereby also that of the hexapole $S_4$). These two parameters permit two of the following three image aberrations to be freely set, namely third-order field curvature, off-axis astigmatism and spherical aberrations, in such a manner that compensation of two of these image aberrations occurs. As already described, the third aberration (described by means of the third order spherical aberration) can be influenced in the desired way by appropriate choice of the geometrical parameters, and in particular the distance, so that extensive compensation of the third image aberration is possible.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An electron-optical corrector for eliminating third order aberrations, such as spherical aberrations, field curvature and off-axis astigmatism; said corrector being devoid of third-order off-axis coma, third-order distortion and first-order chromatic aberrations of the first degree, the corrector having a construction which is symmetrical about the central plane in the direction of the linear optical axis, wherein a first hexapole of a first length is first positioned in the direction of the beam path, followed by a first circular lens, a second hexapole of a second length, followed by a second circular lens, which is followed by a third hexapole with the same strength as the first hexapole and twice the first length of the first hexapole, the separation of the first circular lenses of the same strength being 2f of the focal length, the second hexapole being positioned in the principal focus between the first and second circular lenses, and the distance of the circular lens from the first hexapole being chosen such that the inner plane of the first hexapole comes to lie in the front principal focus of the circular lens that is positioned downstream, and the center of the second and third hexapoles is positioned in the focal plane and this is finally followed by further elements of the corrector, which are set up symmetrically to the center plane of the third hexapole.

2. The electron-optical corrector according to claim 1, wherein the first and second hexapole strengths are in each case chosen so as to eliminate the off-axis astigmatism, as well as the field curvature of the entire system, and the distance from the adjacent lenses of the entire system is chosen so that the third-order spherical aberration can be influenced to the extent of compensation.

3. The electron-optical corrector according to claim 1, wherein the section of the first and a fourth hexapole is azimuthally rotated about the optical axis with respect to the section formed by the first, third and a fifth hexapole.

4. The electron-optical corrector according to claim 3, wherein the first, second, third, fourth and fifth hexapoles are generated in a twelve-pole element comprising 12 electrodes or pole shoes.

5. The electron-optical corrector according to claim 1, wherein two of the aforementioned correctors are positioned in series by means of a circular lens doublet, the distance between the two circular lenses corresponding to twice their focal length, and the distance of a last hexapole of the first corrector to the first circular lens, and the same applying to the distance of the second circular lens of the circular lens doublet to the first hexapole.

6. Use of an electron-optical corrector according to claim 1 in a size-reducing electron-optical system, in particular lithography, wherein the mask to be imaged is located in the object plane and a wafer is located in the image plane, comprising a projection lens located downstream of the object plane in the direction of the beam path and an objective lens located upstream of the image plane, wherein the corrector is inserted in the beam path downstream of the projection lens.

7. Use of an electron-optical corrector according to claim 1 in a size-reducing electron-optical system, in particular lithography, wherein the mask to be imaged is located in the object plane and a wafer is located in the image plane, comprising a projection lens located downstream of the object plane in the direction of the beam path and an objective lens located upstream of the image plane, wherein a transfer lens between the corrector and objective lens.

8. An electron optical corrector comprising:
a first hexapole;
a first circular lens;
a second hexapole;
a second circular lens; and
a third hexapole,
wherein said first hexapole is arranged in front of said first circular lens,
wherein said second hexapole is arranged between said first circular lens and said second circular lens, and
wherein said third hexapole is arranged downstream from said second circular lens.

9. The electron optical corrector of claim 8, wherein said first hexapole has a first length, said third hexapole has a second length, and wherein said second length is twice said first length.

10. The electron optical corrector of claim 8, wherein said first circular lens and said second circular lens have an identical focal length, and wherein between said first circular lens and said second circular lens a distance is provided which is twice said focal length.

11. The electron optical corrector of claim 10, wherein said first circular lens and said second circular lens define a telescopic system with an inlet focal plane upstream of said first circular lens and a principal focal plane between said first and said second circular lens, and wherein said first hexapole is positioned such that an inner plane of said first hexapole lies in said inlet focal plane and said second hexapole being positioned in said principal focal plane.

12. The electron optical corrector of claim 8, wherein said first hexapole has a first strength, said second hexapole has a second strength, wherein said first and second strengths are determined so as to eliminate an off axis astigmatism as well as a field curvature of an entire optical system, and wherein a distance of said corrector from adjacent lenses of said entire system is determined so that a third-order spherical aberration can be influenced.

13. The electron optical corrector of claim 8, wherein said first, second and third hexapoles each have sections and wherein said section of one of said first, second, and third hexapole is azimuthally rotated with respect to said sections of other sections of said first, second, and third hexapoles.

14. The electron optical corrector of claim 8, wherein said at least one of said first, second, and third hexapoles are generated in a twelve pole element having twelve electrodes or twelve pole shoes.

15. An electron optical corrector comprising:
a first hexapole;
a first circular lens;
a second hexapole;
a second circular lens;
a third hexapole;
a third circular lens;
a fourth hexapole;
a fourth circular lens; and
a fifth hexapole,
wherein said first hexapole is arranged in front of said first circular lens, wherein said second hexapole is arranged between said first circular lens and said second circular lens,
wherein said third hexapole is arranged between said second and said third circular lens,
wherein said fourth hexapole is arranged between said third circular lens and said fourth circular lens,
wherein said fifth hexapole is arranged behind said fourth circular lens, and
wherein said electron optical corrector is symmetrical to a center plane of said third hexapole.

16. The electron optical corrector of claim 15, wherein said first hexapole has a first length, said third hexapole has a second length, and wherein said second length is twice said first length.

17. The electron optical corrector of claim 15, wherein said first circular lens and said second circular lens have an identical focal length, and wherein between said first circular lens and said second circular lens a distance is provided which is twice said focal length.

18. The electron optical corrector of claim 17, wherein said first circular lens and said second circular lens define a telescopic system with an inlet focal plane upstream of said first circular lens and a principal focal plane between said first and said second circular lens, and wherein said first hexapole is positioned such that an inner plane of said first hexapole lies in said inlet focal plane and said second hexapole being positioned in said principal focal plane.

19. The electron optical corrector of claim 15, wherein said first hexapole has a first strength, said second hexapole has a second strength, wherein said first and second strengths are determined so as to eliminate an off-axis astigmatism as well as a field curvature of an entire optical system, and wherein a distance of said corrector from adjacent lenses of said entire system is determined so that a third-order spherical aberration can be influenced.

20. The electron optical corrector of claim 15, wherein said first, second, and third hexapoles each have sections, and wherein said section of one of said first, second, and third hexapole is azimuthally rotated with respect to said sections of other sections of said first, second, and third hexapoles.

21. The electron optical corrector of claim 15, wherein said at least one of said first, second, and third hexapoles are generated in a twelve pole element having twelve electrodes or twelve pole shoes.

22. An electron optical system comprising:
   an object plane;
   a projection lens; and
   an art image plane;
   wherein said projection lens images said object plane into said image plane and an electron optical corrector, said electron optical corrector comprising:
   a first hexapole;
   a first circular lens;
   a second hexapole;
   a second circular lens;
   a third hexapole;
   a third circular lens;
   a fourth hexapole;
   a fourth circular lens; and
   a fifth hexapole,
   wherein said first hexapole is arranged in front of said first circular lens,
   wherein said second hexapole is arranged between said first circular lens and said second circular lens,
   wherein said third hexapole is arrange between said second and said third circular lens,
   wherein said fourth hexapole is arranged between said third circular lens and said fourth circular lens, and
   wherein said fifth hexapole is arranged downstream from said fourth circular lens, and wherein said electron optical corrector is symmetrical to a center plane of said third hexapole.

23. The electron optical system of claim 22, wherein said electron optical corrector is arranged downstream of said projection lens.

24. The electron optical system of claim 22, further comprising an objective lens upstream of said object plane.

25. The electron optical system of claim 22, wherein said corrector is arranged upstream of said object plane and wherein a transfer lens is provided between said objective lens and said electron optical corrector.

26. An electron optical corrector comprising:
   a first corrector component and a second corrector component, which are of identical design and arranged in series;
   a circular lens doublet arranged between said first and second corrector component, said first and second corrector component each comprising a first hexapole;
   a first circular lens;
   a second hexapole;
   a second circular lens;
   a third hexapole;
   a third circular lens;
   a fourth hexapole;
   a fourth circular lens; and
   a fifth hexapole,
   wherein said first hexapole is arranged in front of said first circular lens,
   wherein said second hexapole is arranged between said first circular lens and said second circular lens,
   wherein said third hexapole is arranged between said second and said third circular lens,
   wherein said fourth hexapole is arranged between said third circular lens and said fourth circular lens,
   wherein said fifth hexapole is arranged downstream from said fourth lens, and
   wherein said electron optical corrector is symmetrical to a center plane of said third hexapole.

* * * * *